(12) United States Patent
Hsu (10) Patent No.: US 8,536,876 B2
(45) Date of Patent: Sep. 17, 2013

(54) METHOD AND DEVICE FOR INSPECTING STRIPS OF TOUCH PANEL

(75) Inventor: Shih-Chieh Hsu, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 409 days.

(21) Appl. No.: 13/034,145

(22) Filed: Feb. 24, 2011

(65) Prior Publication Data
US 2012/0187954 A1   Jul. 26, 2012

(30) Foreign Application Priority Data
Jan. 21, 2011 (TW) .............................. 100102229 A (51) Int. Cl.
*G01R 31/02* (2006.01)
*G06F 3/041* (2006.01)

(52) U.S. Cl.
USPC ........................... 324/537; 345/173; 702/116

(58) Field of Classification Search
USPC .............. 324/537, 555, 500, 76.11; 327/517, 327/500; 345/173, 174; 702/108, 116, 117, 702/118, 119, 120
See application file for complete search history.

(56) References Cited

U.S. PATENT DOCUMENTS

| | | | |
|---|---|---|---|
| 2011/0006832 A1* | 1/2011 | Land et al. ..................... | 327/517 |
| 2011/0057905 A1* | 3/2011 | Yu et al. ......................... | 345/174 |
| 2012/0038595 A1* | 2/2012 | Park et al. ..................... | 345/176 |

* cited by examiner

*Primary Examiner* — Hoai-An D Nguyen
(74) *Attorney, Agent, or Firm* — WPAT, PC; Justin King (57) ABSTRACT

A method for inspecting the strips of a touch panel is disclosed. The method includes providing a first signal to a first driven first strip of a plurality of first strips and generating a plurality of continuous first differences according to signals on a plurality of second strips; providing the first signal to the first driven first strip and a second driven first strip of the plurality of first strips and generating a plurality of continuous second differences according to the signals on the plurality of second strips; and determining if there is a broken second strip between the first and second driven first strips based on the continuous first and second differences. Herein, the plurality of first and second strips intersect each other on the touch panel to form a plurality of intersecting regions.

35 Claims, 8 Drawing Sheets

```
┌─────────────────────────────────────┐
│   PROVIDING A TOUCH PANEL INCLUDING A   │
│ PLURALITY OF FIRST STRIPS AND A PLURALITY OF│
│            SECOND STRIPS.           │
│                 542                 │
└─────────────────────────────────────┘
                  │
                  ▼
┌─────────────────────────────────────┐
│ AT A FIRST TIME, PROVIDING A FIRST SIGNAL TO A │
│  FIRST DRIVEN FIRST STRIP OF THE PLURALITY OF  │
│  FIRST STRIPS, AND AT LEAST ONE SUBTRACTOR    │
│  GENERATES A PLURALITY OF CONTINUOUS FIRST    │
│      DIFFERENCES BASED ON SIGNALS OF THE      │
│          PLURALITY OF SECOND STRIPS.          │
│                     544                       │
└─────────────────────────────────────┘
                  │
                  ▼
┌─────────────────────────────────────┐
│ AT A SECOND TIME, PROVIDING THE FIRST SIGNAL │
│    TO A SECOND DRIVEN FIRST STRIP OF THE     │
│  PLURALITY OF FIRST STRIPS, AND THE AT LEAST │
│  ONE SUBTRACTOR GENERATES A PLURALITY OF     │
│  CONTINUOUS SECOND DIFFERENCES BASED ON      │
│  SIGNALS OF THE PLURALITY OF SECOND STRIPS.  │
│                    546                       │
└─────────────────────────────────────┘
                  │
                  ▼
┌─────────────────────────────────────┐
│  DETERMINING IF THERE IS A BROKEN SECOND   │
│  STRIP BASED ON THE CONTINUOUS FIRST AND   │
│            SECOND DIFFERENCES.             │
│                   548                      │
└─────────────────────────────────────┘
```

FIG. 5C

METHOD AND DEVICE FOR INSPECTING STRIPS OF TOUCH PANEL

BACKGROUND OF THE INVENTION

1. Field of the Invention

The present invention relates to a method and device for inspecting a touch panel, and more particularly, to a method and device for inspecting strips (or sensors or lines) of a touch panel.

2. Description of the Prior Art

Touch panel are widely used in various electronic devices. With the advance of technology and user demands, touch control has brought convenience into many devices, from small portable electronic devices to large display panel. However, during manufacturing of touch panels, connections of strips (or sensors) on the touch panel may fail (broken or have poor contact) due to various reasons, which adversely affects production cost and product functionality. In order to ensure quality of the products and to improve the manufacturing process, a method and device inspecting the connection status of the strips on a touch panel to determine if there is a broken strip as well as the accurate location on the strip is sought after.

In order to solve these problems, the present invention provides a method and device for inspecting strips of a touch panel, which readily determines if there is a broken strip on the touch panel and the accurate broken location on the strip to provide information for improving manufacturing processes and ensure quality of the products.

SUMMARY OF THE INVENTION

During manufacturing of touch panels, strips may be broken and cannot function properly. Thus, the present invention proposes a method and device for inspecting strips of a touch panel by inspecting strips in sections by mutual-capacitance sensing. In inspecting each section, a first driven strip can be driven to generate a first sensing result, and then the first driven strip and a second driven strip are simultaneously driven to generate a second sensing result to determine if there is a broken strip. In this way, the ability to detect a broken strip near the edges of the touch panel where signals are weaker can be improved.

The present invention discloses a method for inspecting strips of a touch panel, comprising: providing a first signal to a plurality of first axial strips; electrically coupling a first input of a subtractor to one of two second axial strips to be inspected of a plurality of second axial strips, and outputting a first output value, wherein a second input of the subtractor is floated or coupled to a zero-value signal; electrically coupling the second input of the subtractor to the other one of the two second axial strips to be inspected, and outputting a second output value; and comparing the first and second output values to determine a connection status of each of the two second axial strips to be inspected.

The present invention also discloses a device for inspecting strips of a touch panel, comprising: a signal unit for providing a first signal to a plurality of first axial strips; a subtractor for inspecting two second axial strips to be inspected of a plurality of second axial strips, wherein, at a first inspection time, a first input of a subtractor is electrically coupled to one of the two second axial strips to be inspected, and a first output value is outputted, and at a second inspection time, a second input of the subtractor is electrically coupled to the other one of the two second axial strips to be inspected, and a second output value is outputted; and a comparison determining unit for receiving and comparing the first and second output values to determine a connection status of each of the two second axial strips to be inspected.

The present invention further discloses a method for inspecting strips of a touch panel, comprising: providing a first signal to a plurality of first axial strips; electrically coupling two inputs of a subtractor to two second axial strips to be inspected of a plurality of second axial strips, respectively, and outputting an output value; and comparing the output value with a predetermine threshold to determine a connection status of each of the two second axial strips to be inspected.

The present invention further discloses a device for inspecting strips of a touch panel, comprising: a signal unit for providing a first signal to a plurality of first axial strips; subtractor for inspecting two second axial strips to be inspected of a plurality of second axial strips, wherein two inputs of a subtractor are electrically coupled to the two second axial strips to be inspected, respectively, and an output value is outputted; and a comparison determining unit for receiving and comparing the output value with a predetermine threshold to determine a connection status of each of the two second axial strips to be inspected.

The present invention further discloses a method for inspecting strips of a touch panel, comprising: providing a touch panel including a plurality of first strips and a plurality of second strips, wherein the first and second strips intersect each other to form a plurality of intersecting regions; providing a first signal to a first driven first strip of the plurality of first strips, and generating a plurality of continuous first differences based on signals of the plurality of second strips, wherein each of the continuous first differences is generated based on a corresponding pair of second strips; providing the first signal to the first driven first strip and a second driven first strip of the plurality of first strips, and generating a plurality of continuous second differences based on signals of the plurality of second strips; and determining if there is a broken second strip based on the continuous first and second differences.

The present invention also discloses a device for inspecting strips of a touch panel, comprising: a first selecting circuit for receiving a first signal, and at a first time, providing a first signal to a first driven first strip of a plurality of first strips, and at a second time, providing the first signal to the first driven first strip and a second driven first strip of the plurality of first strips; at least one subtractor for generating a plurality of continuous first differences and a plurality of continuous second differences based on signals of the plurality of second strips at the first time and second time, respectively, wherein each of the continuous first and second differences is generated based on a corresponding pair of second strips; and a comparison determining unit for determining if there is a broken second strip based on the continuous first and second differences.

The present invention have numerous advantages and technical effects compared to the prior art. With the technical schemes provided above, the method and device for inspecting strips of a touch panel have the following advantages and technical effects:

1. Each broken strip can be detected.

2. Possible broken location on the strip can be determined and used as reference for improving the manufacturing process.

3. By comparing two simultaneously driven strips and one driven strip, a broken strip can still be determined even at the area near the edges of the touch panel where signals are weaker.

The above description is only an outline of the technical schemes of the present invention. Preferred embodiments of the present invention are provided below in conjunction with the attached drawings to assist one with ordinary skill in the art in better understanding said and other objectives, features and advantages of the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Figure 1A:
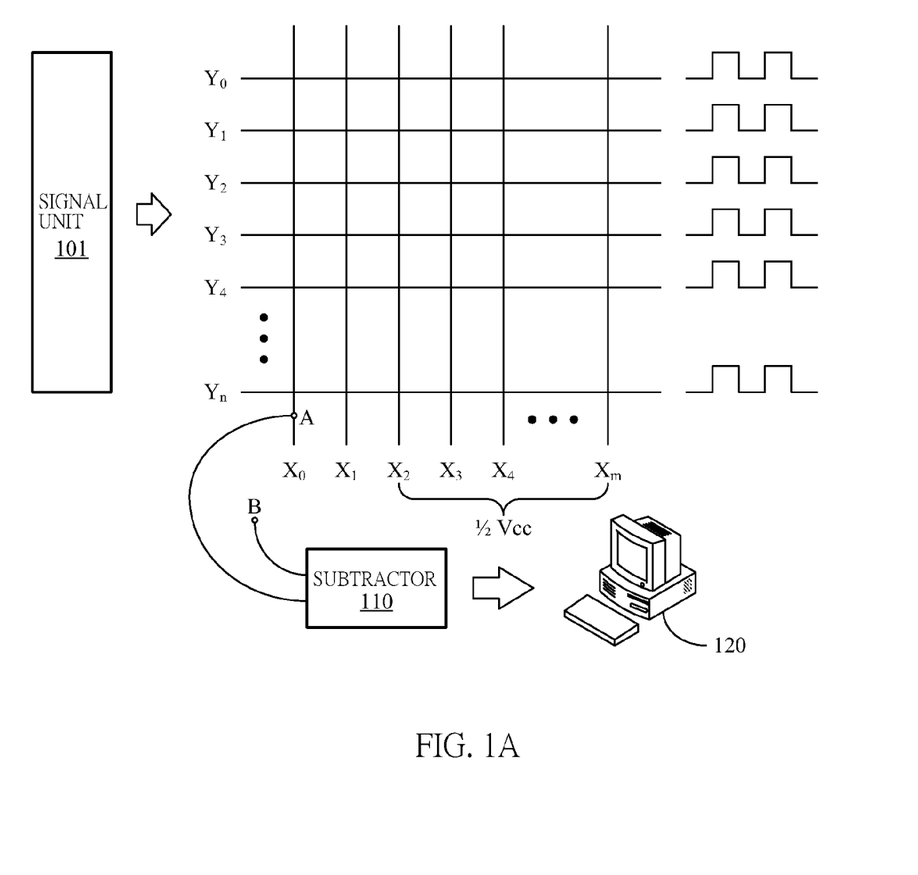
FIGS. 1A and 1B are schematic diagrams illustrating a device according to a preferred embodiment of the present invention.
Figure 1B:
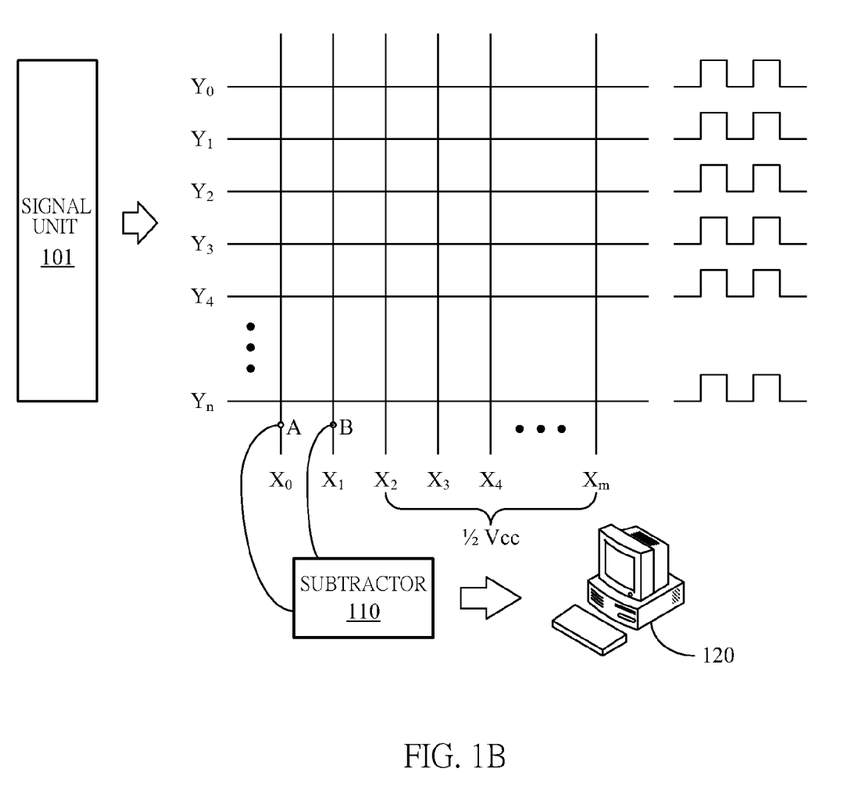

Referring to FIGS. 1A and 1B, schematic diagrams illustrating a device according to a preferred embodiment of the present invention are shown. A plurality of first (axial) strips $Y_0 \sim Y_n$ and a plurality of second (axial) strips $X_0 \sim X_n$ are strips intersecting each other on a touch panel (not shown) to form a plurality of intersecting regions. This is well known in the art, so further descriptions will not be provided. A signal unit 101 is provided for inputting a first signal to the plurality of first axial strips $Y_0 \sim Y_n$, wherein the first signal includes a pulse-width modulation (PWM) signal. A subtractor 110 is provided for inspecting two second axial strips (e.g. $X_0$ and $X_1$) of the plurality of second axial strips $X_0 \sim X_n$ to be inspected, wherein a first input A of the subtractor 110 is electrically coupled to one of the two second axial strips to be inspected (e.g. $X_0$) at a first (inspection) time, and outputs a first output value; a second input B of the subtractor 110 is electrically coupled to the other one of the two second axial strips to be inspected (e.g. $X_1$) at a second (inspection) time, and outputs a second output value. At the first and second inspection times, the rest of the plurality of second axial strips (e.g. $X_2 \sim X_m$) is provided with a voltage level signal, which includes ½ Vcc. A comparison determining unit 120 is provided for receiving and comparing the first and second output values from the subtractor 110 to determine if the two second axial strips to be inspected $X_0$ and $X_1$ are broken. Comparing the first and second output values may include generating a difference, and when this difference is greater than a predetermined threshold, then it is determined that one of the two second axial strips to be inspected is broken. Comparing the first and second output values may include directly comparing the first and second output values. For example, when the first and second output values are equal to each other, then it is determined that one of the two second axial strips to be inspected is broken. In an embodiment of the present invention, the comparison determining unit 120 can be a comparison circuit or a computer; the two second axial strips to be inspected can be two adjacent or non-adjacent strips.

Referring to FIG. 1B, the two inputs of the subtractor 110 can be electrically coupled to the two second axial strips to be inspected $X_0$ and $X_1$ at the same time, respectively, and an output value is output from the subtractor 110. The comparison determining unit 120 then receives this output value and compares it with a predetermined threshold to determine the connection status of each of the two second axial strips $X_0$ and $X_1$. Similarly, the two second axial strips to be inspected can be two adjacent or non-adjacent strips.

Figure 2:
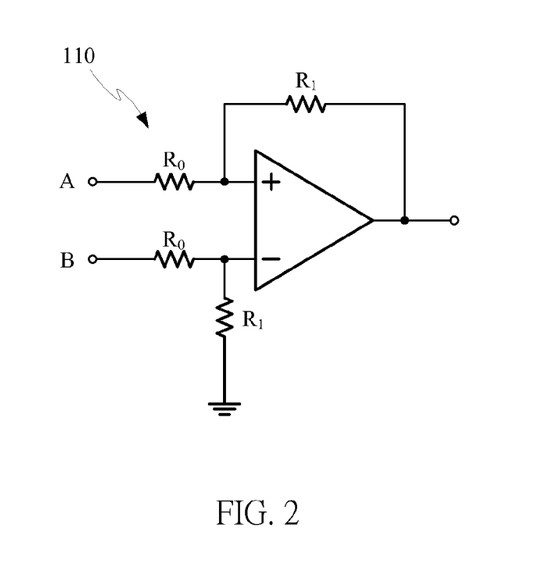
FIG. 2 is a circuit diagram of a subtractor according to a preferred embodiment of the present invention.

Referring now to FIG. 2, a circuit diagram illustrating the subtractor 110 according to a preferred embodiment of the present invention is shown. The subtractor 110 is an operational amplifier with an output feedback. It should be noted that this embodiment is merely provided for illustrating a preferred embodiment of the present invention, and the present invention is not limited to this.

Figure 3:
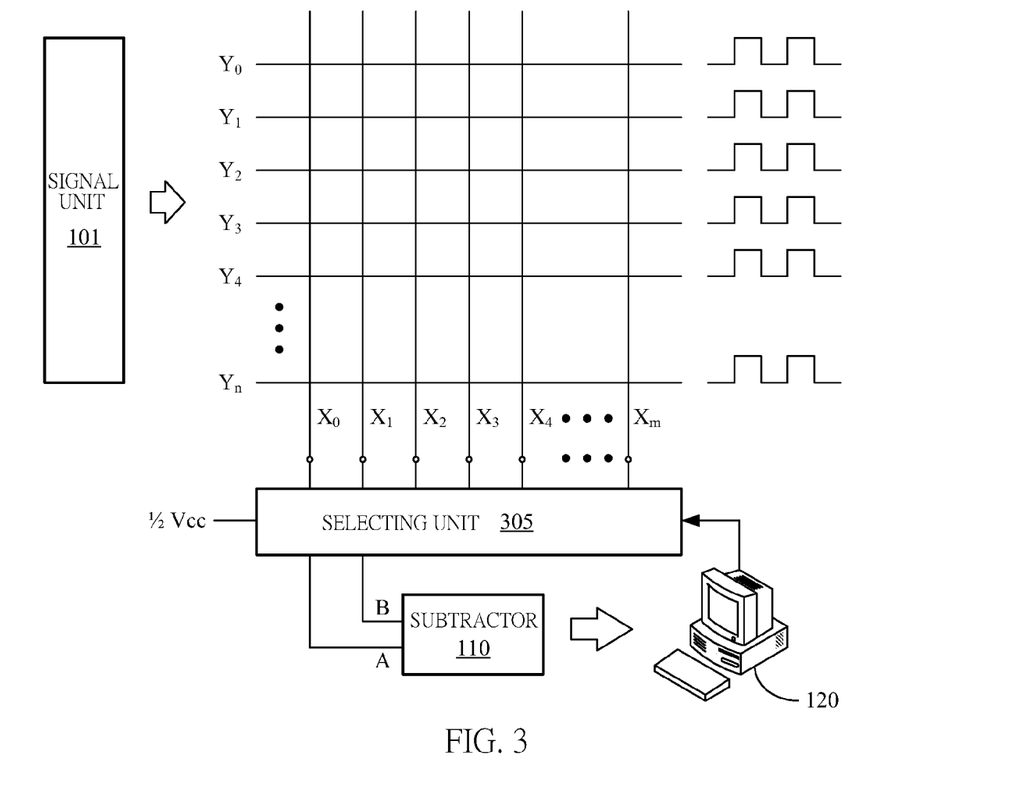
FIG. 3 is a schematic diagram illustrating a device according to another preferred embodiment of the present invention.

Referring to FIG. 3, a schematic diagram illustrating a device according to another preferred embodiment of the present invention is shown. The difference between FIG. 3 and FIG. 1B is that there is an additional selecting circuit 305, which is controlled by the comparison determining unit 120 to select two second axial strips to be inspected to be electrically coupled to the subtractor 110. For example, in response to the control of the comparison determining unit 120, the selecting circuit 305 electrically couples the two second axial strips to be inspected $X_0$ and $X_1$ to the subtractor 110, which then outputs an output value. This output value is compared with a predetermined threshold to determine the connection status of each of the two second axial strips to be inspected $X_0$ and $X_1$. As another example, in response to the control of the comparison determining unit 120, at a first inspection time, the selecting circuit 305 electrically couples the second axial strip $X_0$ to the first input A of the subtractor 110, which then outputs a first output value; at a second inspection time, the selecting circuit 305 electrically couples the second axial strip $X_0$ and $X_1$ to the first and second inputs A and B of the subtractor 110, respectively, which then outputs a second output value. The difference between the first and second outputs is compared with a predetermined threshold to determine the connection status of each of the two second axial strips to be inspected $X_0$ and $X_1$.

Figure 4A:
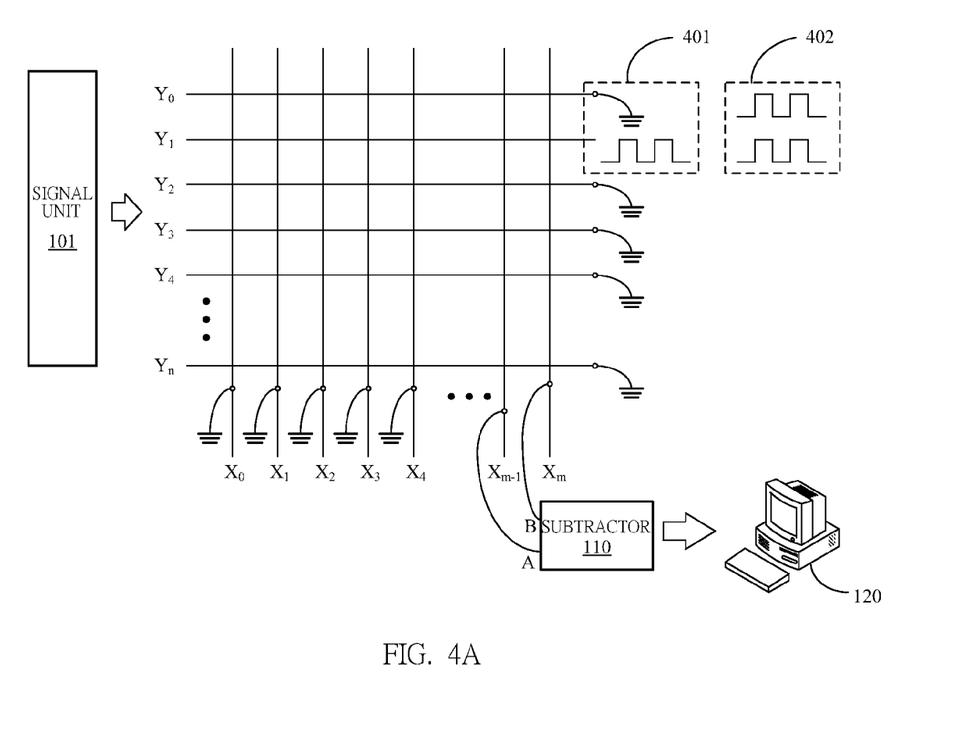
FIG. 4A is a schematic diagram illustrating a device according to yet another preferred embodiment of the present invention.

Referring to FIG. 4A, a schematic diagram illustrating a device according to yet another preferred embodiment of the present invention is shown. A signal unit 101 is provided for providing, at a first time, a first signal to a first driven first strip (e.g. $Y_1$, as indicated by dash line 401) of a plurality of first strips $Y_0 \sim Y_n$; at a second time, the first signal to the first driven first strip $Y_1$ and a second driven first strip $Y_1$ (e.g. $Y_0$, as indicated by dash line 402), wherein the first signal includes a PWM signal, and the first strips not provided with the first signal are grounded. At least one subtractor 110 is provided for generating a plurality of continuous first differences and a plurality of continuous second differences at the first and second times, respectively, based on signals of a plurality of second strips $X_0 \sim X_m$. Each of the continuous first and second differences is generated based on a corresponding pair of second strips. A comparison determining unit 120 is provided for determining if there is a broken second strip between the first driven first strip $Y_1$ and the second driven first strip $Y_0$ based on the continuous first and second differences. In particular, when the difference between the first and second differences corresponding to any pair of second strips exceeds a zero-value range and is positive, then a first sensed second strip of this pair of second strips is broken between the first driven first strip and the second driven first strip; when the difference between the first and second differences corresponding to any pair of second strips exceeds a zero-value range and is negative, then a second sensed second strip of this pair of second strips is broken between the first driven first strip and the second driven first strip. One with ordinary skill in the art can appreciate that the zero-value range can be a range greater and/or smaller than zero. The values within this zero-value range can be regarded as zero.

Take FIG. 4A as an example, when the difference between the first and second differences of the second strips $X_{m-1}$ and $X_m$ exceeds a zero-value range and is positive, then the second strips $X_{m-1}$ is broken between the first driven first strip $Y_1$ and the second driven first strip $Y_0$; when the difference between the first and second differences of the second strips $X_{m-1}$ and $X_m$ exceeds a zero-value range and is negative, then the second strips $X_m$ is broken between the first driven first strip $Y_1$ and the second driven first strip $Y_0$.

In this embodiment, each pair of the second strips can be two adjacent or non-adjacent strips, and each first difference can be generated sequentially or simultaneously, and each second difference can also be generated sequentially or simultaneously.

Figure 4B:
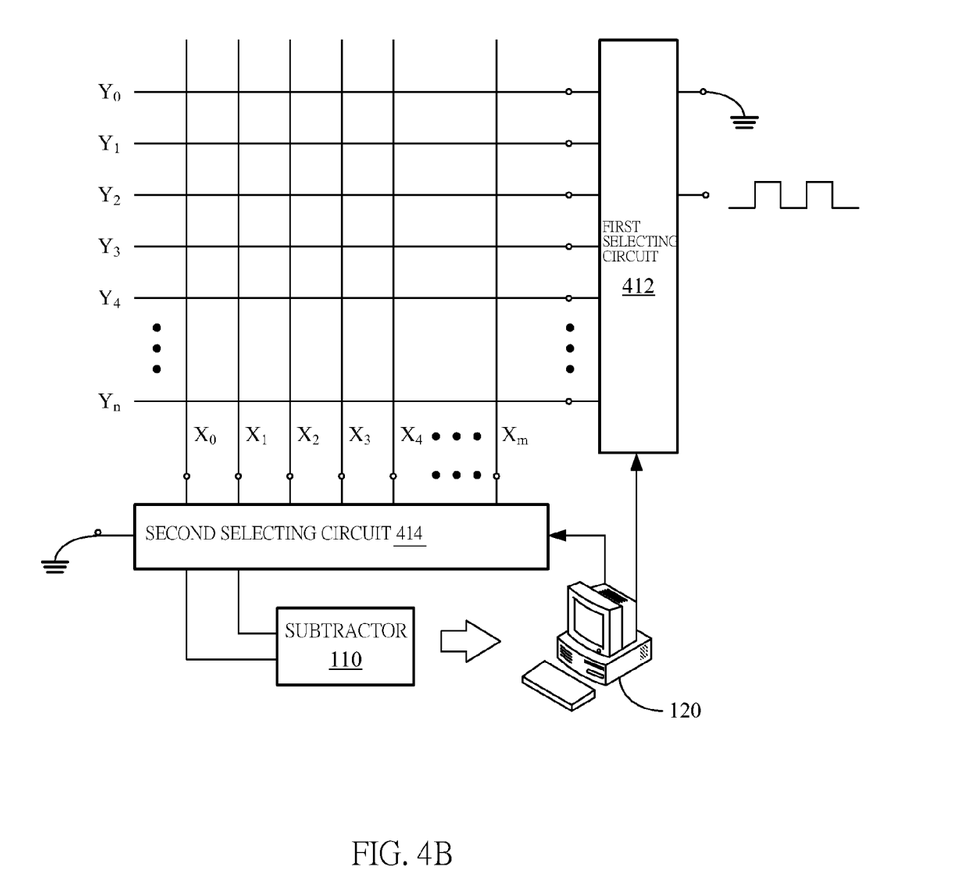
FIG. 4B is a schematic diagram illustrating a device according to still another preferred embodiment of the present invention.

Referring to FIG. 4B, a schematic diagram illustrating a device according to still another preferred embodiment of the present invention is shown. In this embodiment, a first selecting circuit 412 receives a first signal from a signal unit (not shown, referring to FIG. 4A), and is controlled by a comparison determining unit 120 to electrically couple the first signal to a first driven first strip of a plurality of first strips $Y_0 \sim Y_n$ at a first time; electrically couple the first signal to the first driven first strip and a second driven first strip of the plurality of first strips $Y_0 \sim Y_n$ at a second time, wherein the first signal includes a PWM signal, and the rest of the first strips not provided by the first signal are grounded. A second selecting circuit 414 electrically couples a plurality of second strips X0~Xm, and is controlled by the comparison determining unit 120 to select and electrically couple a second strip to at least one subtractor 110 at the first and second times, whereas the rest of the second strips not selected is electrically coupled to ground potential. At least one subtractor 110 is provided for generating a plurality of continuous first differences and a plurality of continuous second differences at the first and second times, respectively, based on signals of the second strips $X_0 \sim X_m$. Each of the continuous first and second differences is generated based on a corresponding pair of second strips. A comparison determining unit 120 is provided for determining if there is a broken second strip between the first driven first strip and the second driven first strip based on the continuous first and second differences. In this embodiment, when the number of subtractor 110 is one, then the comparison determining unit 120 controls the second selecting circuit 414 to select a corresponding second strip to be electrically coupled to the subtractor 110 in sequence to generate the continuous first and second differences at the first and second times, respectively; when the number of subtractor 110 is plural, then the comparison determining unit 120 controls the second selecting circuit 414 to select corresponding second strips to be electrically coupled to the subtractor 110 simultaneously to generate the continuous first and second differences at the first and second times, respectively. In addition, the second strips selected and electrically coupled to the subtractor(s) 110 by the second selecting circuit 414 include adjacent or non-adjacent second strips. Determining if there is a broken second strip between the first driven first strip and the second driven first strip based on the continuous first and second differences is the same as that described with respect to FIG. 4A, and it will be not be repeated.

Figure 5A:
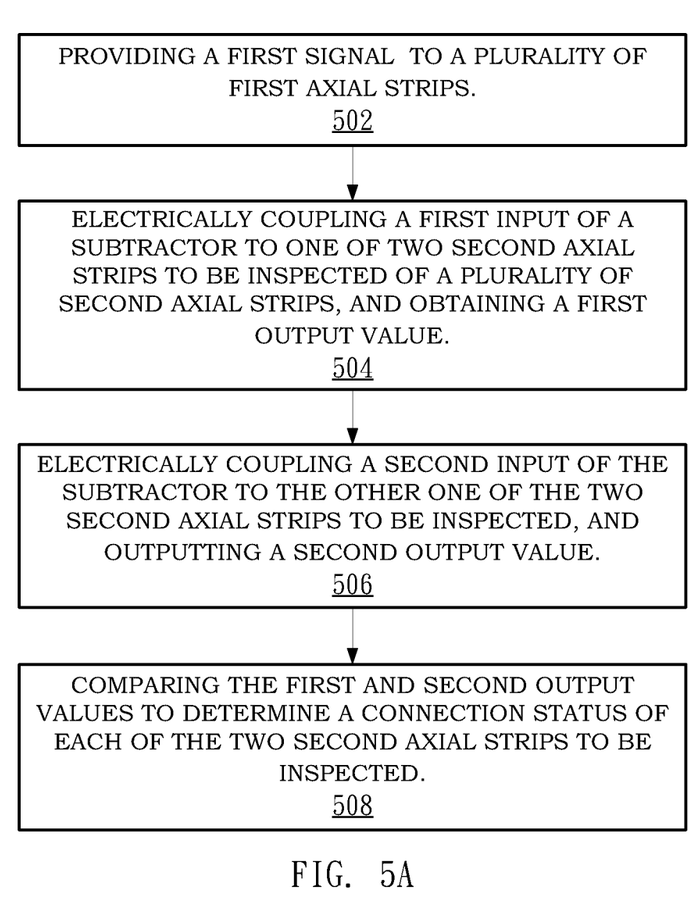
FIG. 5A is a flowchart illustrating a preferred embodiment of the present invention.

Referring to FIG. 5A, a flowchart illustrating a preferred embodiment of the present invention is shown. In step 502, a first signal is provided by a first signal 101 to a plurality of first axial strips $Y_0 \sim Y_n$, wherein the first signal includes a PWM signal. In step 504, a first input A of a subtractor 110 is electrically coupled to one of two second axial strips to be inspected of a plurality of second axial strips $X_0 \sim X_m$, and a first output value is obtained, wherein a second input B of the subtractor 110 is floated or coupled to a zero-value signal, such as a ground potential or ½ Vcc. One with ordinary skill in the art can recognize that other zero-value signals are possible. The second axial strips $X_0 \sim X_m$ other than the two second axial strips to be inspected are electrically coupled to a voltage level signal, which includes ½ Vcc. In step 506, a second input B of the subtractor 110 is electrically coupled to the other one of the two second axial strips to be inspected, and a second output value is obtained. In step 508, a comparison determining unit 120 compares the first and second output values to determine a connection status of each of the two second axial strips to be inspected, wherein comparing the first and second output values further includes comparing a difference, and when the difference is larger than a predetermined threshold, then the comparison determining unit 120 determines that the other one of the two second axial strips to be inspected is broken. In addition, in this embodiment, the two second axial strips to be inspected can be two adjacent second axial strips or two non-adjacent second axial strips.

Figure 5B:
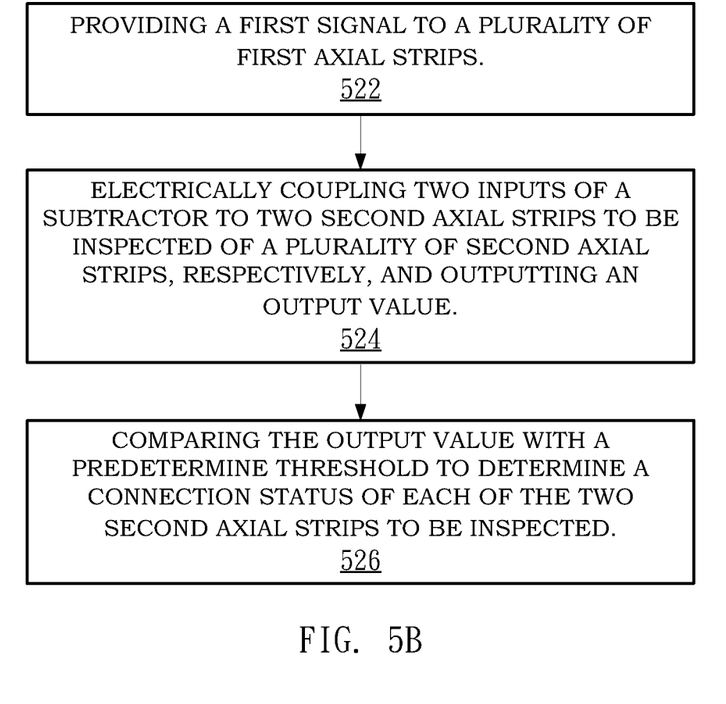
FIG. 5B is a flowchart illustrating another preferred embodiment of the present invention.

Referring to FIG. 5B, a flowchart illustrating another preferred embodiment of the present invention is shown. In step 522, a first signal is provided by a signal unit 101 to a plurality of first axial strips $Y_0 \sim Y_n$, wherein the first signal includes a PWM signal. In step 524, two inputs of a subtractor 110 are electrically coupled to two second axial strips to be inspected of a plurality of second axial strips $X_0 \sim X_m$, respectively, and an output value is obtained, wherein the second axial strips $X_0 \sim X_m$ other than the two second axial strips to be inspected are electrically coupled to a voltage level signal, which includes ½ Vcc. In step 526, a comparison determining unit 120 compares the output value and a predetermine threshold to determine a connection status of each of the two second axial strips to be inspected, wherein when the output value is larger than the predetermined threshold, then the comparison determining unit 120 determines that the other one of the two second axial strips to be inspected is broken. Similarly, in this embodiment, the two second axial strips to be inspected can be two adjacent second axial strips or two non-adjacent second axial strips.

Figure 5C:
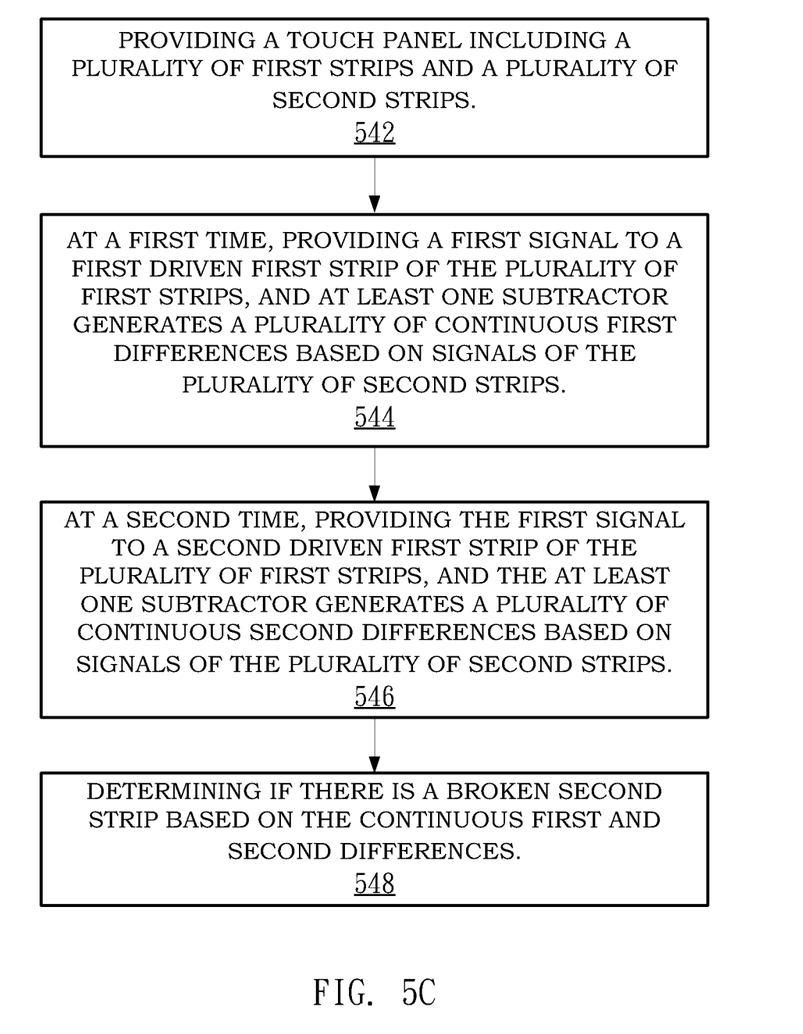
FIG. 5C is a flowchart illustrating still another preferred embodiment of the present invention.

Referring to FIG. 5C, a flowchart illustrating still another preferred embodiment of the present invention is shown. In step 542, a touch panel including a plurality of first strips $Y_0 \sim Y_n$ and a plurality of second strips $X_0 \sim X_m$ is provided, wherein the first and second strips $Y_0 \sim Y_n$ and $X_0 \sim X_m$ intersect each other to form a plurality of intersecting regions. In step 544, a signal unit 101 provides, at a first time, a first signal to a first driven first strip of the plurality of first strips $Y_0 \sim Y_n$, and at least one subtractor 110 generates a plurality of continuous first differences based on signals of the plurality of second strips $X_0 \sim X_m$, wherein the first strips not provided with the first signal are electrically coupled to a ground potential, and each of the continuous first differences is generated based on a corresponding pair of second strips. In step 546, the signal unit 101 provides, at a second time, the first signal to a second driven first strip of the plurality of first strips $Y_0 \sim Y_n$, and the at least one subtractor 110 generates a plurality of continuous second differences based on signals of the plurality of second strips $X_0 \sim X_m$, wherein the first strips not provided with the first signal are electrically coupled to a ground potential, and each of the continuous second differences is generated based on a corresponding pair of second strips. In step 548, a comparison determining unit 120 determines if there is a broken second strip based on the continuous first and second differences. In particular, when the difference between the first and second differences corresponding to any pair of second strips exceeds a zero-value range and is positive, then a first sensed second strip of this pair of second strips is broken between the first driven first strip and the second driven first strip; when the difference between the first and second differences corresponding to any pair of second strips exceeds a zero-value range and is negative, then a second sensed second strip of this pair of second strips is broken between the first driven first strip and the second driven first strip. In this embodiment, the first driven first strip and the second driven first strip can be selected in turn from the first strips $Y_0 \sim Y_n$ by a first selecting circuit 412; each pair of second strips measured by the subtractor 110 can be adjacent or non-adjacent second strips; and each of the first differences and second differences can be generated in turn or simultaneously by a second selecting circuit 412 depending on the number of subtractor 110.

The at least one subtractor is operatively coupled to one end of the second strip via a switching device. One with ordinary skill in the art can appreciate that the switching device may be the selecting circuit 305 described above or other multiplexers or switching circuits.

In an example of the present invention, the selection of a first strip can start from the first strip closer to the side where the second strip and the subtractor is coupled, and sequentially moves towards the other side. Thus, during the comparison of the first and second differences, when a second strip or a pair of second strips are determined to be broken for the first time, in subsequent comparison, this second strip or this pair of second strips will also regarded as broken. In another example of the present invention, the selection of a first strip can start from the first strip away from the side where the second strip and the subtractor is coupled, and sequentially moves towards the other side. Thus, during the comparison of the first and second differences, when a second strip or a pair of second strips are determined to be broken for the first time, in subsequent comparison, this second strip or this pair of second strips may be regarded as broken until a determination of not broken is made. In other words, the location of a broken line on a second strip or a pair of second strips can be the section the first time a broken line is discovered or the section the last time a broken line is discovered. This section is between the first driven first strip and the second driven first strip described above.

One with ordinary skill in the art can recognize that after the connection statuses of the second axial strips or the second strips are determined, the second axial strips or the second strips can be driven to determine the connection statuses of the first axial strips or the first strips in a similar manner.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for inspecting strips of a touch panel, comprising:
   providing a first signal to a plurality of first axial strips;
   electrically coupling a first input of a subtractor to one of two second axial strips to be inspected of a plurality of second axial strips, and outputting a first output value, wherein a second input of the subtractor is floated or coupled to a zero-value signal;
   electrically coupling the second input of the subtractor to the other one of the two second axial strips to be inspected, and outputting a second output value; and
   comparing the first and second output values to determine a connection status of each of the two second axial strips to be inspected.

2. The method for inspecting strips of a touch panel of claim 1, wherein the first signal includes a pulse-width modulation (PWM) signal.

3. The method for inspecting strips of a touch panel of claim 1, wherein the plurality of second axial strips other than the two second axial strips to be inspected are provided with a voltage level signal, which includes ½ Vcc.

4. The method for inspecting strips of a touch panel of claim 1, wherein the two second axial strips to be inspected include one of the following combinations: the two second axial strips to be inspected are adjacent two second axial strips; and the two second axial strips to be inspected are non-adjacent two second axial strips.

5. The method for inspecting strips of a touch panel of claim 1, wherein comparing the first and second output values further includes generating a difference, and when the difference is larger than a predetermined threshold, then it is determined that one of the two second axial strips to be inspected is broken.

6. A method for inspecting strips of a touch panel, comprising:
   providing a first signal to a plurality of first axial strips;
   electrically coupling two inputs of a subtractor to two second axial strips to be inspected of a plurality of second axial strips, respectively, and outputting an output value; and
   comparing the output value with a predetermine threshold to determine a connection status of each of the two second axial strips to be inspected.

7. The method for inspecting strips of a touch panel of claim 6, wherein the first signal includes a pulse-width modulation (PWM) signal.

8. The method for inspecting strips of a touch panel of claim 6, wherein the plurality of second axial strips other than the two second axial strips to be inspected are provided with a voltage level signal, which includes ½ Vcc.

9. The method for inspecting strips of a touch panel of claim 6, wherein the two second axial strips to be inspected include one of the following combinations: the two second axial strips to be inspected are adjacent two second axial strips; and the two second axial strips to be inspected are non-adjacent two second axial strips.

10. The method for inspecting strips of a touch panel of claim 6, wherein when the output value is larger than the predetermined threshold, then it is determined that the other one of the two second axial strips to be inspected is broken.

11. A device for inspecting strips of a touch panel, comprising:
- a signal unit for providing a first signal to a plurality of first axial strips;
- a subtractor for inspecting two second axial strips to be inspected of a plurality of second axial strips, wherein, at a first inspection time, a first input of a subtractor is electrically coupled to one of the two second axial strips to be inspected, and a first output value is outputted, and at a second inspection time, a second input of the subtractor is electrically coupled to the other one of the two second axial strips to be inspected, and a second output value is outputted; and
- a comparison determining unit for receiving and comparing the first and second output values to determine a connection status of each of the two second axial strips to be inspected.

12. The device for inspecting strips of a touch panel of claim 11, wherein the first signal includes a pulse-width modulation (PWM) signal.

13. The device for inspecting strips of a touch panel of claim 11, wherein the plurality of second axial strips other than the two second axial strips to be inspected are provided with a voltage level signal, which includes ½ Vcc.

14. The device for inspecting strips of a touch panel of claim 11, wherein the two second axial strips to be inspected include one of the following combinations: the two second axial strips to be inspected are adjacent two second axial strips; and the two second axial strips to be inspected are non-adjacent two second axial strips.

15. The device for inspecting strips of a touch panel of claim 11, wherein the comparison determining unit comparing the first and second output values further includes generating a difference, and when the difference is larger than a predetermined threshold, then it is determined that the other one of the two second axial strips to be inspected is broken.

16. The device for inspecting strips of a touch panel of claim 11, further comprising a selecting circuit controlled by the comparison determining unit for selecting the two second axial strips to be inspected to be electrically coupled to the subtractor.

17. A device for inspecting strips of a touch panel, comprising:
- a signal unit for providing a first signal to a plurality of first axial strips;
- a subtractor for inspecting two second axial strips to be inspected of a plurality of second axial strips, wherein two inputs of a subtractor are electrically coupled to the two second axial strips to be inspected, respectively, and an output value is outputted; and
- a comparison determining unit for receiving and comparing the output value with a predetermine threshold to determine a connection status of each of the two second axial strips to be inspected.

18. The device for inspecting strips of a touch panel of claim 17, wherein the first signal includes a pulse-width modulation (PWM) signal.

19. The device for inspecting strips of a touch panel of claim 17, wherein the plurality of second axial strips other than the two second axial strips to be inspected are provided with a voltage level signal, which includes ½ Vcc.

20. The device for inspecting strips of a touch panel of claim 17, wherein the two second axial strips to be inspected include one of the following combinations: the two second axial strips to be inspected are adjacent two second axial strips; and the two second axial strips to be inspected are non-adjacent two second axial strips.

21. The device for inspecting strips of a touch panel of claim 17, wherein when the output value is larger than the predetermined threshold, then it is determined that the other one of the two second axial strips to be inspected is broken.

22. The device for inspecting strips of a touch panel of claim 17, further comprising a selecting circuit controlled by the comparison determining unit for selecting the two second axial strips to be inspected to be electrically coupled to the subtractor.

23. A method for inspecting strips of a touch panel, comprising:
- providing a touch panel including a plurality of first strips and a plurality of second strips, wherein the first and second strips intersect each other to form a plurality of intersecting regions;
- providing a first signal to a first driven first strip of the plurality of first strips, and generating a plurality of continuous first differences based on signals of the plurality of second strips, wherein each of the continuous first differences is generated based on a corresponding pair of second strips;
- providing the first signal to the first driven first strip and a second driven first strip of the plurality of first strips, and generating a plurality of continuous second differences based on signals of the plurality of second strips; and
- determining if there is a broken second strip based on the continuous first and second differences.

24. The method for inspecting strips of a touch panel of claim 23, wherein when the difference between the first and second differences corresponding to any pair of second strips exceeds a zero-value range, then one of this pair of second strips is broken between the first driven first strip and the second driven first strip.

25. The method for inspecting strips of a touch panel of claim 23, wherein when the difference between the first and second differences corresponding to any pair of second strips exceeds a zero-value range and is positive, then a first sensed second strip of this pair of second strips is broken between the first driven first strip and the second driven first strip; and when the difference between the first and second differences corresponding to any pair of second strips exceeds a zero-value range and is negative, then a second sensed second strip of this pair of second strips is broken between the first driven first strip and the second driven first strip.

26. The method for inspecting strips of a touch panel of claim 23, wherein the first strips not provided with the first signal remain at ground potential.

27. The method for inspecting strips of a touch panel of claim 23, wherein the first driven first strip and the second driven first strip are selected in turn from the first strips by a first selecting circuit.

28. The method for inspecting strips of a touch panel of claim 23, wherein the second strips in each pair of second strips are adjacent or not adjacent.

29. The method for inspecting strips of a touch panel of claim 23, wherein each first difference is generated in turn or simultaneously, and each second difference is generated in turn or simultaneously.

30. A device for inspecting strips of a touch panel, comprising:
- a first selecting circuit for receiving a first signal, and at a first time, providing a first signal to a first driven first strip of a plurality of first strips, and at a second time, providing the first signal to the first driven first strip and a second driven first strip of the plurality of first strips;
- at least one subtractor for generating a plurality of continuous first differences and a plurality of continuous second differences based on signals of the plurality of second strips at the first time and second time, respectively, wherein each of the continuous first and second differences is generated based on a corresponding pair of second strips; and a comparison determining unit for determining if there is a broken second strip based on the continuous first and second differences.

31. The device for inspecting strips of a touch panel of claim 30, wherein when the difference between the first and second differences corresponding to any pair of second strips exceeds a zero-value range, then one of this pair of second strips is broken between the first driven first strip and the second driven first strip.

32. The device for inspecting strips of a touch panel of claim 30, wherein when the difference between the first and second differences corresponding to any pair of second strips exceeds a zero-value range and is positive, then a first sensed second strip of this pair of second strips is broken between the first driven first strip and the second driven first strip; and when the difference between the first and second differences corresponding to any pair of second strips exceeds a zero-value range and is negative, then a second sensed second strip of this pair of second strips is broken between the first driven first strip and the second driven first strip.

33. The device for inspecting strips of a touch panel of claim 30, wherein the first strips not provided with the first signal remain at ground potential.

34. The device for inspecting strips of a touch panel of claim 30, wherein the second strips in each pair of second strips are adjacent or not adjacent.

35. The device for inspecting strips of a touch panel of claim 30, wherein the second strips are electrically coupled to the at least one subtractor by a second selecting circuit.

* * * * *